United States Patent
Vockenberger et al.

(10) Patent No.: US 11,264,737 B2
(45) Date of Patent: Mar. 1, 2022

(54) SOLDER-FREE COMPONENT CARRIER CONNECTION USING AN ELASTIC ELEMENT AND METHOD

(71) Applicant: AT&S Austria Technologie & Systemtechnik Aktiengesellschaft, Leoben (AT)

(72) Inventors: Christian Vockenberger, Leoben (AT); Rainer Frauwallner, Tragöß (AT); Thomas Krivec, Zeltweg (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/814,684

(22) Filed: Mar. 10, 2020

(65) Prior Publication Data
US 2020/0295474 A1  Sep. 17, 2020

(30) Foreign Application Priority Data

Mar. 11, 2019 (EP) ..................................... 19161858

(51) Int. Cl.
*H05K 1/18* (2006.01)
*H01R 4/48* (2006.01)
(Continued)

(52) U.S. Cl.
CPC ............ *H01R 4/4809* (2013.01); *H01R 4/04* (2013.01); *H01R 4/34* (2013.01); *H05K 1/0353* (2013.01);
(Continued)

(58) Field of Classification Search
CPC .......... H01R 4/4809; H01R 4/04; H01R 4/34; H05K 1/0353; H05K 1/115; H05K 1/181;
(Continued)

(56) References Cited

U.S. PATENT DOCUMENTS 4,970,624 A * 11/1990 Arneson ................... H01R 4/04
361/749
5,994,648 A    11/1999 Glovatsky et al.
(Continued)

FOREIGN PATENT DOCUMENTS

DE           41 29 056 A1    3/1993
DE    10 2007 046 493 A1    4/2009
(Continued)

OTHER PUBLICATIONS

EESR in EP Patent Application No. 19161858.6; Dec. 11, 2019; pp. 1-8; European Patent Office; 80298, Munich, Germany.

*Primary Examiner* — Steven T Sawyer
(74) *Attorney, Agent, or Firm* — Robert A. Blaha; Smith Tempel Blaha LLC (57) ABSTRACT

A component carrier is illustrated and described. The component carrier has i) a stack with at least one electrically conductive layer structure and/or at least one electrically insulating layer structure, and ii) at least one elastic element attached to the stack and configured to reversibly connect the component carrier with a further component carrier by elastically deforming the at least one elastic element and essentially not deforming the stack and the further component carrier.

11 Claims, 2 Drawing Sheets

(51) Int. Cl.
  *H01R 4/04*  (2006.01)
  *H01R 4/34*  (2006.01)
  *H05K 1/03*  (2006.01)
  *H05K 1/11*  (2006.01)

(52) U.S. Cl.
  CPC ............. *H05K 1/115* (2013.01); *H05K 1/181* (2013.01); *H05K 1/185* (2013.01); *H05K 2201/09036* (2013.01); *H05K 2201/09509* (2013.01); *H05K 2201/10265* (2013.01)

(58) Field of Classification Search
  CPC .......... H05K 2201/09036; H05K 2201/09509; H05K 2201/10265; H05K 1/141; H05K 2201/10409; H05K 2201/0311; H05K 3/326; H05K 1/182–187; H05K 2201/1059
  See application file for complete search history.

(56) References Cited

U.S. PATENT DOCUMENTS

| | | | | |
|---|---|---|---|---|
| 6,175,480 | B1* | 1/2001 | Karmazyn | H01C 7/10 |
| | | | | 174/260 |
| 6,472,613 | B1 | 10/2002 | Reichard | |
| 9,078,373 | B1* | 7/2015 | Lamorey | H05K 1/181 |
| 2006/0035410 | A1* | 2/2006 | Shiffer | H05K 1/184 |
| | | | | 438/111 |
| 2009/0158232 | A1 | 6/2009 | Ronkka et al. | |
| 2011/0088936 | A1 | 4/2011 | Schaaf et al. | |
| 2011/0138616 | A1 | 6/2011 | Cho et al. | |
| 2011/0193491 | A1 | 8/2011 | Choutov et al. | |
| 2012/0153501 | A1 | 6/2012 | Murai et al. | |
| 2013/0271924 | A1* | 10/2013 | Shen | H05K 1/182 |
| | | | | 361/728 |
| 2014/0001897 | A1* | 1/2014 | Wallrafen | H05K 1/183 |
| | | | | 310/71 |
| 2015/0144386 | A1* | 5/2015 | Kim | H05K 1/186 |
| | | | | 174/260 |

FOREIGN PATENT DOCUMENTS

| | | |
|---|---|---|
| DE | 10 2014 113 518 A1 | 4/2015 |
| JP | H08273765 A | 10/1996 |
| JP | H1065308 A | 3/1998 |
| JP | 2001160677 A | 6/2001 |
| JP | 6139653 B2 | 5/2017 |

\* cited by examiner

SOLDER-FREE COMPONENT CARRIER CONNECTION USING AN ELASTIC ELEMENT AND METHOD

CROSS-REFERENCE TO RELATED APPLICATION

The present application claims priority to European Patent Application No. 19 161 858.6 filed Mar. 11, 2019, the entire contents of which is hereby incorporated herein by reference.

Technical Field

Embodiments of the invention relate to a component carrier, an arrangement comprising the component carrier, a method of manufacturing the component carrier, and a method of using an elastic element in a component carrier connection.

Technological Background

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically and magnetically reliable so as to be operable even under harsh conditions.

There may be a plurality of situations in component carrier manufacturing, when a component carrier should be connected (mechanically and/or electrically) to another component carrier. For example, a smaller unit such as an electronic module may be connected to a larger unit such as a motherboard. Conventionally, this is done by soldering one unit to the other. However, connections made by soldering may suffer a number of disadvantages. For example, mounting of the electronic module can be technically problematic, e.g. due to temperature stress. When the electronic module has been soldered to the main board, it may be difficult to repair and/or exchange said electronic module. This is because a solder connection does not offer flexibility.

In an example from the prior art, a frame structure may be attached/soldered to the layer stack of a printed circuit board. An electronic component or an electronic module may then be fastened to the frame structure. However, the application of the additional frame structure increases the production costs and reduced the available space.

SUMMARY

There may be a need to connect a component carrier with a further component carrier in an efficient and flexible manner without using a solder connection.

According to an exemplary embodiment of the invention, a component carrier is provided. The component carrier (for example a main board or motherboard) comprises: i) a stack comprising at least one electrically conductive layer structure and/or at least one electrically insulating layer structure, and ii) at least one elastic element attached to the stack. Hereby, the elastic element (for example a spring element) is configured to reversibly connect (e.g. via a snap-fit connection) the component carrier with a further component carrier (e.g. a (printed) circuit board, an electronic module, or electronic component) by elastically deforming (e.g. pressing a spring element in a snap-fit connection) the at least one elastic element and essentially not deforming (for example essentially not deforming elastically/plastically) the stack and the further component carrier.

According to another exemplary embodiment of the invention, a (component carrier) arrangement is provided. The arrangement (for example a board-in-board arrangement) comprises: i) a component carrier as described above, and ii) a further component carrier that is (mechanically and/or electrically) connected with the component carrier by the at least one elastic element. Hereby, the elastic element is elastically deformed and the stack and the further component carrier are essentially not deformed.

According to another exemplary embodiment of the invention, a method of manufacturing a component carrier is provided. The method comprises: i) providing a stack comprising at least one electrically conductive layer structure and/or at least one electrically insulating layer structure, ii) attaching at least one elastic element to the stack (for example by integrally forming the elastic element with the stack or by using an adhesive); and iii) configuring (for example by using a spring element) the at least one elastic element for reversibly connecting the component carrier with a further component carrier by elastically deforming the at least one elastic element, essentially without deforming the stack and the further component carrier.

According to another exemplary embodiment of the invention, a method of using an elastic element (in particular a spring element, more in particular a leaf spring) is provided for reversibly connecting (in particular mechanically and/or electrically connecting) a further component carrier (in particular an electronic module), at least partially in a recess of a component carrier.

Overview of Embodiments

In the context of the present application, the term "component carrier" may particularly denote any support structure which is capable of accommodating one or more (electronic) components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers. In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In the context of the present application, the term "further component carrier" may particularly denote a component carrier as described above. The further component carrier may be a smaller unit than the component carrier. For example, the component carrier may be a main board or motherboard comprising at least one elastic element, while the further component carrier may be an electronic module. In an embodiment, the further component carrier may be configured such that it can be (at least partially) placed into a recess of the component carrier (and can be connected using the elastic module). In another embodiment, the component carrier may be the smaller unit (comprising the at least one elastic element) and can be connected, using its at least one elastic element, to a larger unit which may be the further component carrier (in particular in a recess of the further component carrier). In another embodiment, the further component carrier may be an assembly of electronic components (e.g. an integrated circuit) which may be a large and/or complex component that might have to be flexibly removed/changed/replaced at a later time. When the further component carrier is configured as an electronic component, it may not comprise a layer stack as described for the component carrier above.

In the context of the present application, the term "elastic element" may particularly denote any element that is deformable in a reversible manner. For example, when a force is applied to the elastic element, said element may deform and change its size and/or shape. However, when the force is removed, the elastic element may return to its original size and shape. When being in the deformed state, the elastic element may store a potential energy that is released, when the elastic element returns to the un-deformed state. The elastic element may be used to reversibly connect a first unit, such as a component carrier, to a second unit, such as a further component carrier. When the two units are not connected, then the elastic element may be in the un-deformed state, and when the two units are connected, then the elastic element may be in the deformed state. In another embodiment, the elastic element may be only deformed during the insertion of one unit (e.g. further component carrier) into the other unit (e.g. component carrier). Hereby, the elastic element may be again un-deformed, when the units are connected to each other after the step of inserting. In an embodiment, the further component carrier may be located and fixed below a lower end of the elastic element (in a recess of the component carrier). In this manner, the elastic element would be un-deformed again after the insertion. In this case, electric contacts of the further component carrier may be on the bottom side of the further component carrier. In an embodiment, the elastic element may be a spring element (e.g. a spring contact) that may be deformed (i.e. pressed together), when one unit is connected to the other unit. When releasing the units from each other, the spring element may return to its original, un-deformed state. Hence, the connection between the units is reversible, while no other part than the elastic element is deformed.

According to an exemplary embodiment, the invention is based on the idea that a connection between a component carrier with a further component carrier (to a component carrier arrangement) can be done in an efficient and flexible manner without soldering, when attaching at least one elastic element to the (stack of the) component carrier such that, upon a connection between the component carrier and the further component carrier, the elastic element is deformed, while the other components are essentially not deformed. The elastic element may for example be a spring element and the further component carrier may be connected to the component carrier by deforming the spring element and thereby providing a snap-fit connection. When releasing the further component carrier, the elastic element may return to its un-deformed state (thus the connection is reversible). As has already been described above, a solder connection makes it difficult to repair and/or exchange a connected (further) component carrier and does hence not offer flexibility. According to the described solder-free connection, it may be technically feasible to mount a further component carrier on/in a component carrier. The further component carrier may hence be feasible to be repaired and/or exchanged, because the flexibility of the connection is very high. Furthermore, no temperature stress is produced when mounting the further component carrier on/in the component carrier.

While in the prior art a frame structure may have been used to fasten a component to a component carrier, the described invention does (according to an exemplary embodiment) not use such a frame structure at all. On the contrary, a further component carrier may be connected directly into (a recess of) the component carrier without said additional frame structure. In this manner, production costs and space can be saved, while the connection is more robust and flexible.

In the following, further exemplary embodiments of the component carrier, the arrangement, the method and the use thereof will be explained.

In an embodiment, the further component carrier is configured as at least one of a group consisting of: a component carrier having a layer stack, a printed circuit board, a substrate, an interposer, an electronic module, an electronic component.

In a further embodiment, the component carrier is configured as a component carrier having a layer stack, in particular a printed circuit board (more in particular a main board), a substrate, or an interposer.

In a further embodiment, the component carrier comprises a recess in the stack and the recess is configured such that the further component carrier is at least partially placeable into the recess. This may provide the advantage that the connection can be realized in an especially robust and flexible manner, while the integrity is improved (less space required).

The recess (or cavity) may be formed through one or more layers of the stack. The sidewalls of the recess may expose the layer(s) of the stack. The recess may have similar measures as the further component carrier or may have larger measures. The recess can be integrally formed with the stack or can be manufactured later on, e.g. by drilling or sandblasting. The recess may be configured to accommodate the whole further component carrier or merely a part of the further component carrier. In this manner, the connection may be very robust, because the further component carrier may be well protected against mechanical damage, when placed and connected in the recess. Furthermore, the recess can be designed in a very flexible manner such that a plurality of options is enabled. For example, the component carrier arrangement may be more compact and requires less space. In another embodiment, wherein the component carrier is a smaller unit (comprising the at least one elastic element) than the further component carrier, the further component carrier may comprise a further recess and the component carrier (which comprises the at least one elastic element) may be placed into said further recess.

In a further embodiment, the recess is a blind hole. This may provide the advantage that the further component carrier (which is at least partially) in the recess can be efficiently held in place and optionally electrically contacted. The blind hole may comprise a bottom plane and the further component carrier, when placed in the recess, may be at least partially arranged on the bottom plane. In case that there is a physical contact between the bottom plane and the further component carrier, an electric contact may be established in this manner. For example, the bottom plane may comprise electric contacts (such as terminals or pads) that may be connected to electric contacts of the further component carrier. In another embodiment, the connected further component carrier may not be in physical contact with the bottom plane.

In a further embodiment, the recess is a through hole. This may provide the advantage that a (large) further component carrier can be directly intersected between component carrier parts. In particular a large further component carrier may require more accommodation space than a recess can comprise. Hence, a solution may be to provide two opposing component carrier parts and to place the further component carrier between these two separate component carrier parts. In this manner, the connected further component carrier may be held in place only by the at least one elastic element.

In a further embodiment, the elastic element is arranged at a sidewall of the recess. This may provide the advantage that the mechanical connection can be established very robustly. The term "arranged" may, in the present context, refer to "at least partially cover" one or more sidewalls of the recess. The at least one elastic element may be attached at the sidewall or may be attached elsewhere (e.g. at a main surface). The elastic element may be integrally formed with the stack and may thereby be arranged at a sidewall.

In a further embodiment, the elastic element is at least partially attached at a main surface of the stack. This may provide the advantage that the elastic element can be attached in a flexible and robust manner. The at least one elastic element may be attached at the top main surface of the component carrier, e.g. by an adhesive or the elastic element may be integrally formed with the top main layer of the stack. In both cases, the at least one elastic element may be bent in such a manner that it still covers at least a part of a sidewall, i.e. is arranged at said sidewall.

In a further embodiment, the at least one elastic element is at least one spring element, in particular at least one leaf spring. This may provide the advantage that an established (and not cost-intensive) product can be directly implemented into component carrier production. Spring elements such as leaf springs may be attached to or integrally formed with the component carrier, in particular in a recess of the component carrier, in order to enable a mechanical connection with a further component carrier. As many spring elements such as spring contacts are made of electrically conductive material, said elements may also enable an electrical connection.

In a further embodiment, the recess is formed as a through hole and the elastic element comprises a curvature, such that, when the further component carrier is placed into the recess, the curvature at least partially supports a bottom part of the further component carrier. This may provide the advantage that the arrangement is more stable and robust. The curvature may be electrically conductive and may electrically contact an electrically conductive layer structure of the further component carrier.

In a further embodiment, the at least one elastic element comprises or consists of an electrically conductive material, such that an electric connection can be established between at least one electrically conductive layer structure of the component carrier and at least one further electrically conductive layer structure of the further component carrier, when the component carrier is connected with the further component carrier. This may provide the advantage that not only a mechanical but also an electrical connection can be enabled in a feasible manner. The electrical connection of the elastic element may be established to electrically conductive layers exposed at sidewalls of the further component carrier. In another embodiment, the further component carrier may comprise additional electrical contacts (e.g. terminals, pads), in particular at a sidewall, which may be contacted by the elastic element.

In a further embodiment, the electric connection is established between sidewalls of the component carrier and the further component carrier via the at least one elastic element. As described above, the electrical connection may be established via an elastic element that comprises an electrically conductive material. Electrically conductive layer structures of the component carrier stack and the further component carrier stack may be electrically connected in this manner. In another embodiment, the component carrier and/or the further component carrier comprises additional electrical contacts at a sidewall in order to enable the electrical connection.

In a further embodiment, an electric connection is established between a horizontal surface of the component carrier (in particular the bottom surface/plane of the recess) and the further component carrier. This may provide the advantage that an (additional) electrical connection can be formed in a flexible manner without the at least one elastic element. Said connection via bottom plane contacts (in case that the recess is a blind hole) may be formed in addition or alternatively to the electrical connection via the elastic element.

In a further embodiment, the at least one elastic element is configured for establishing a snap-fit connection between the component carrier and the further component carrier. This may provide the advantage that the connection is fast, flexible, and reversible. A snap-fit connection may be used to attach flexible parts to form a final product by pushing interlocking components together. A snap-fit connection may for example be realized using at least one leaf spring.

In a further embodiment, the at least one elastic element is formed as a part of the material of the stack, in particular integrally formed with the stack. This may provide the advantage that the at least one elastic element may be provided in a robust manner, in particular without using additional materials. In an embodiment, an elastic element may be integrally formed with one or more electrically conductive layer structures of the stack. Thereby, the elastic element may be electrically conductive for establishing an electrical connection. In another embodiment, the elastic element may be integrally formed with one or more electrically insulating layer structures of the stack. Thereby, the elastic element may be made of component carrier material (see description below) and may not be electrically conductive. In another embodiment, one elastic element may be integrally formed with one or more electrically insulating layer structures of the stack and another elastic element may be integrally formed with one or more electrically conductive layer structures of the stack.

In a further embodiment, the component carrier further comprises an adhesive, in particular an electrically conductive adhesive, arranged between the at least one elastic element and the stack. This may provide the advantage that the elastic element can be attached to the stack in an especially flexible manner. Using an electrically conductive adhesive may still enable the formation of an electrical connection via the elastic element.

In a further embodiment, the component carrier (and/or the further component carrier) further comprises a guiding structure for aligning the further component carrier (and/or the component carrier). This may provide the advantage that the alignment of the component carrier and a further component carrier is very precise and stable. In the present context, the term "guiding structure" may denote any physical structure (e.g. a protrusion, a recess, a line) that facilitates the mounting of a further component carrier to/in a component carrier.

In a further embodiment of the arrangement, the component carrier is a larger unit (in particular a main board) than the further component carrier (which may be an electronic module). In particular, the component carrier comprises the recess in which the further component carrier is at least partially placeable.

In a further embodiment of the arrangement, the further component carrier is a larger unit (in particular a main board) than the component carrier. In particular, the further component carrier comprises a further recess in which the component carrier (which may be an electronic module) is at least partially placeable. This specific embodiment may provide the advantage that the smaller unit comprises the elastic element(s) and can be applied in a very flexible manner.

In an embodiment of the arrangement, the further component carrier is at least partially placed into the recess. In a further embodiment, the further component carrier is fully placed into the recess. As described above, placing the further component carrier in the recess may protect the further component carrier against mechanical damage and may improve the integrity of the system (i.e. making the arrangement more compact such that less space is required).

In a further embodiment, the at least one elastic element is arranged at a sidewall of the recess and the further component carrier is placed between two opposing sidewalls of the recess such that the at least one elastic element is arranged between a sidewall of the further component carrier and the sidewall of the recess. Hereby, the recess is formed either as a blind hole and the further component carrier is placed on the bottom of the recess, or the recess is formed as a through hole and the further component carrier is only connected by the elastic element.

In a further embodiment, the component carrier is configured as a socket and the further component carrier is configured as a plug. This may provide the advantage that an efficient and robust electrical connection can be established. In an embodiment, the component carrier and the further component carrier may be specifically designed to enable a robust plug-socket connection.

In a further embodiment, the arrangement is configured as a board-in-board arrangement. This may provide the advantage that an economically important product can be provided in an especially flexible and robust manner without soldering. "Board-in-board" is hereby a known technical term.

In another embodiment, the component carrier and/or the further component carrier comprises reinforcement elements. This may provide the advantage that a (thin) component carrier is still robust enough for a feasible connection. In case that the (further) component carrier is a thin structure, e.g. an electronic module with one layer structure, a reinforcement structure may be used to make the structure stable. This measure may be necessary in order to establish a robust connection (e.g. a snap-fit) with one or more elastic elements. In particular, when the further component carrier is placed in a through-hole recess, a certain stiffness may be required. The term "reinforcement structure" in this context may denote any structure that is suitable to reinforce a component carrier. For example, a special layer of glass-fiber reinforced epoxy resin may be used. In another example, a special metal layer may reinforce the component carrier.

In another embodiment, the arrangement further comprises an electrically conductive connection element that extends at least partially through the component carrier and the further component carrier, wherein the connection element mechanically and electrically connects the component carrier and the further component carrier. This may provide the advantage that a robust mechanical and electrical connection between the two units can be efficiently established, while the arrangement is also applicable for high performances. While the elastic element may comprise a small cross-section and may therefore not be feasible for high currents, the connection element may provide a high performance also for high currents.

In another embodiment, at least one of the component carrier and the further component carrier comprises a thread, wherein the electrically conductive connection element is configured as a screw, and wherein at least a part of the electrically conductive connection element is located in the thread. Hereby, the component carrier may be a main board that comprises a first thread. The further component carrier may be an electronic module that comprises a second thread. The connection element may now be configured as a screw that is (at least partially) driven through the first thread and the second thread. In this manner, respective electrically conductive layers of the component carrier and the further component carrier can be efficiently connected.

In another embodiment, at least one of the component carrier and the further component carrier comprises a through-hole, wherein the electrically conductive connection element is configured as a bar, and wherein at least a part of the electrically conductive connection element is located in the through-hole. Hereby, the component carrier may be a main board that comprises a first through-hole. The further component carrier may be an electronic module that comprises a second through-hole. The connection element may now be configured as a bar (stab, rod) that is at least partially driven through the first through-hole and the second through-hole. In this manner, electrically conductive layers of the component carrier and the further component carrier can be efficiently connected. At the end of at least one through-hole, a screw nut or nut bolt may be used to fix the connection element.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier and/or the further component carrier is configured as one of a group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as a component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as reinforced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up material, polytetrafluoroethylene (Teflon®), a ceramic, and a metal oxide. Teflon® is a registered mark of The Chemours Company FC LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as an electrically insulating layer structure.

In an embodiment, the at least one electrically conductive layer structure comprises at least one of a group of materials consisting of copper, aluminum, nickel, silver, gold, palladium, and tungsten. Although copper is usually preferred, other materials or coated versions thereof are possible as well, in particular materials coated with supra-conductive material such as graphene.

In an embodiment, wherein the further component carrier is configured as an electronic component, the at least one electronic component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as a component.

In an embodiment, the component carrier is a laminate-type component carrier. In such an embodiment, the component carrier is a compound of multiple layer structures which are stacked and connected together by applying a pressing force and/or heat.

In an embodiment, the features described above for the component carrier may also apply to the further component carrier.

In an embodiment, the further component carrier comprises a recess part and the component carrier comprises a protrusion part that may be placed in the recess, when connecting the component carrier and the further component carrier.

BRIEF DESCRIPTION OF THE DRAWINGS

The aspects defined above and further aspects of the invention are apparent from the examples of embodiment to be described hereinafter and are explained with reference to these examples of embodiment.

DETAILED DESCRIPTION OF EXEMPLARY EMBODIMENTS

The illustrations in the drawings are schematically presented. In different drawings, similar or identical elements are provided with the same reference signs.

Before referring to the drawings, exemplary embodiments will be described in further detail, some basic considerations will be summarized based on which exemplary embodiments of the invention have been developed.

According to an exemplary embodiment, an opening (a recess) is created in a main PCB (a component carrier). Either this opening goes through all layers (of the PCB stack) or just through some layers of the PCB (cavity-like). Inside the opening, there are electrical connections from the main board to an additional electronic module (a further component carrier). The electrical connections are either on the side wall in (Z direction) or on the bottom of the cavity. The electronic module will be placed in the opening. On the electronic module there are also electrical connections either on the side wall or on the top or bottom side. The mechanical fixture of the electronic module to the main board is done through so called spring contacts (elastic elements). The spring contacts are mounted on the side walls either in the opening of the main board or on the electronic module. To ensure a robust electric connection, the spring contacts are also used for the electric connection. The opening in the main board can be rectangular, or can have alternative shapes. The electronic module and/or the opening can comprise edge plated contacts.

According to an exemplary embodiment, a basic idea is to have an alternative method of connecting an electronic module to a PCB main board, wherein the method does not require soldering which makes it easy to replace the module and as no reflow process is required, there is less stress on the components.

Figure 1:
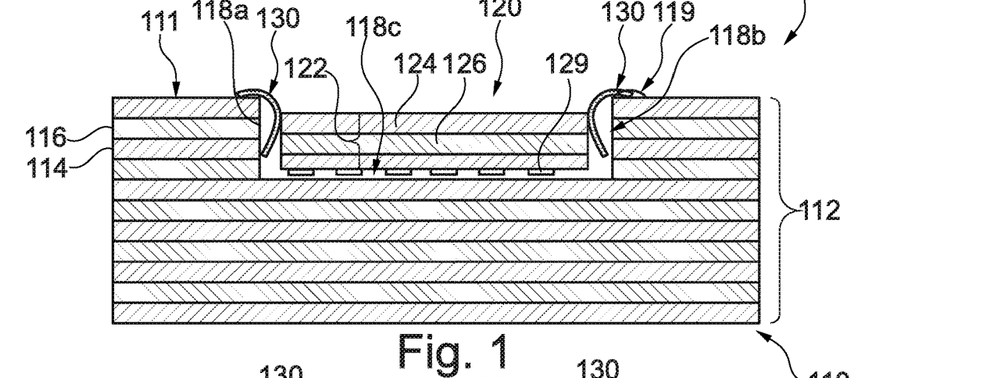
FIG. 1 illustrates a cross-sectional view of a component carrier arrangement, wherein the recess is a blind hole, according to an exemplary embodiment of the invention.

FIG. 1 shows a component carrier arrangement 100 comprising a component carrier 110 and a further component carrier 120. The component carrier 110 is a large unit such as a main board, while the further component carrier 120 is a smaller unit such as an electronic module. The arrangement 100 is hereby a board-in-board design. The component carrier 110 has a stack 112 comprising a plurality of alternating electrically conductive layer structures 114 and electrically insulating layer structures 116. The further component carrier 120 has a further stack 122 comprising a plurality of alternating further electrically conductive layer structures 124 and further electrically insulating layer structures 126. Two elastic element 130, being leaf springs, are attached to the stack 112 of the component carrier 110 using an adhesive 119. The elastic element 130 is configured to reversibly connect the component carrier 110 with the further component carrier 120 by elastically deforming the at least one elastic element 130, i.e. by forming a snap-fit connection. Hereby, the stack 112 of the component carrier 110 and the further component carrier 120 are not deformed.

The component carrier 110 comprises a recess 118 in the stack 112, wherein the recess 118 is configured such that the further component carrier 120 can be fully placed into the recess 118. In the example described in FIG. 1, the recess is a blind hole with a bottom plane 118c. The elastic elements 130 are arranged at the sidewalls 118a, b of the recess 118 and are attached (via the adhesive 119) at the main surface 111 of the stack 112. The two elastic elements 130 consist of an electrically conductive material, such that an electrical connection (in addition to the mechanical connection) can be established between at least one electrically conductive layer structure 114 of the component carrier 110 and at least one further electrically conductive layer structure 124 of the further component carrier 120. Said electrical connection is established between the sidewalls 118a, b of the component carrier 110 and the further component carrier 120 via the elastic elements 130. Alternatively or additionally, the electrical connection is established between the bottom plane 118c of the component carrier 110 recess 118 and electric contacts 129 of the further component carrier 120. Said electrical connection via the electric contacts 129 does not involve the elastic element 130.

Figure 2:
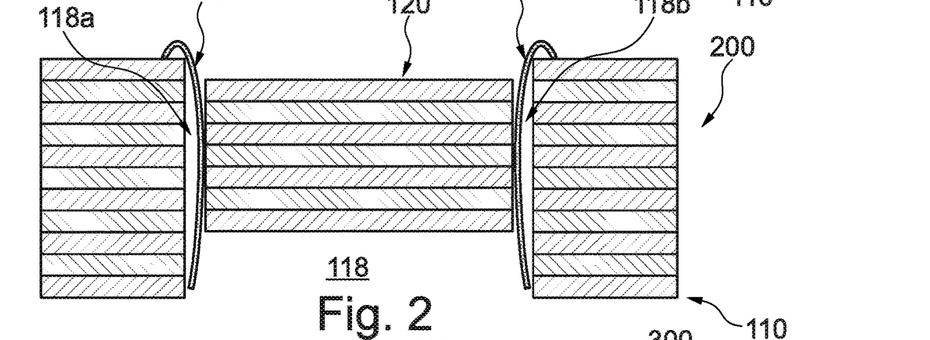
FIG. 2 illustrates a cross-sectional view of another component carrier arrangement, wherein the recess is a through hole, according to an exemplary embodiment of the invention.

FIG. 2 shows a component carrier arrangement 200 comprising a component carrier 110 and a further component carrier 120. The main difference between the embodiment shown in FIG. 2 and the embodiment shown in FIG. 1 (described above) is, that the recess 118 in FIG. 2 is a through hole. The further component carrier 120 is placed between the two sidewalls 118a, b of the recess 118 such that two elastic elements 130 are respectively arranged between a respective sidewall of the further component carrier 120 and the respective sidewall 118a, b of the recess 118. In this embodiment, the further component carrier 120 is only connected to the component carrier 110 and held in place by the elastic element 130.

Figure 3:
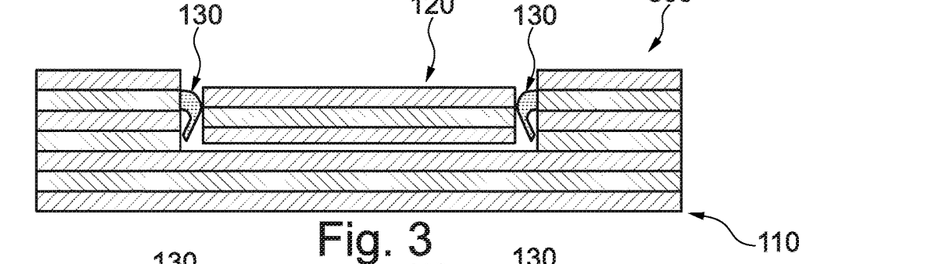
FIG. 3 illustrates a cross-sectional view of another component carrier arrangement, wherein the elastic element is integrally formed with the stack, according to an exemplary embodiment of the invention.

FIG. 3 shows a component carrier arrangement 300, wherein the elastic elements 130 are integrally formed with the stack 112. Hereby, the elastic elements 130 form a part of one electrically insulating layer structure 116 and are hence made of a component carrier material.

Figure 4:
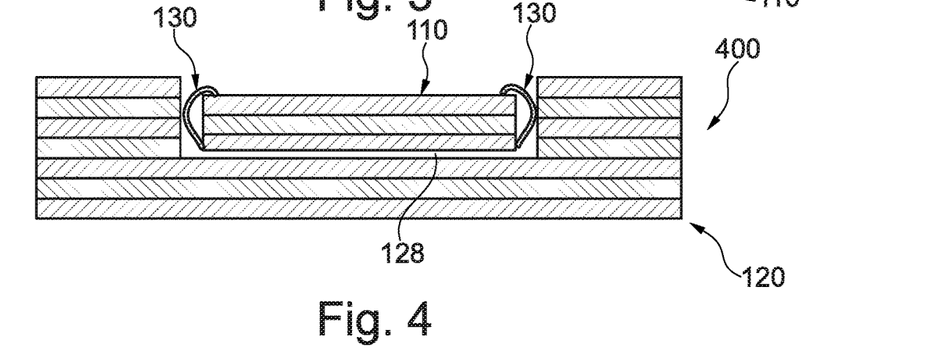
FIG. 4 illustrates a cross-sectional view of another component carrier arrangement according to an exemplary embodiment of the invention.

FIG. 4 shows a component carrier arrangement 400, wherein the component carrier 110, that comprises the at least one elastic element 130, is a smaller unit (e.g. an electronic module) than the further component carrier 120. The further component carrier (e.g. a main board) 120 comprises a further recess 128 and the component carrier 110 is connected in the further recess 128 to the further component carrier 120.

Figure 5:
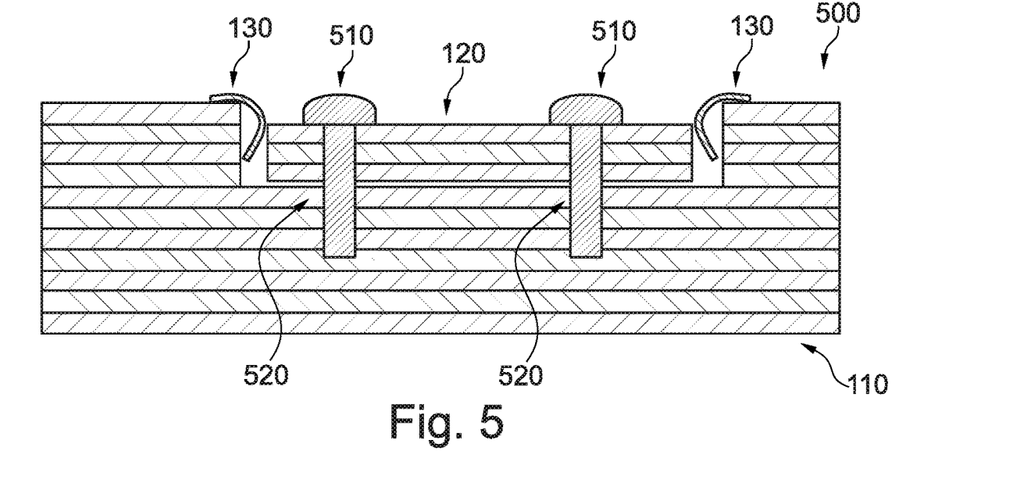
FIG. 5 illustrates a cross-sectional view of another component carrier arrangement with a connection element according to an exemplary embodiment of the invention.

FIG. 5 illustrates a cross-sectional view of the component carrier arrangement 500 with a connection element 510. The electrically conductive connection element 510 extends through the component carrier 110 and the further component carrier 120, wherein the connection element 510 mechanically and electrically connects an electrically conductive layer 114 of the component carrier 110 with an electrically conductive layer 124 of the further component carrier 120. The component carrier 110 and the further component carrier 120 each comprises a thread 520 and the electrically conductive connection element 510 is configured as a screw. The electrically conductive connection element 510 is hereby located in the threads 520. Thus, the electrically conductive connection element 510 is driven through the first thread 520 of the component carrier 110, through the recess 118, and then through the second thread 520 of the further component carrier 120. In this manner, electrically conductive layers 114, 124 of the component carrier 110 and the further component carrier 120 can be efficiently connected.

Figure 6:
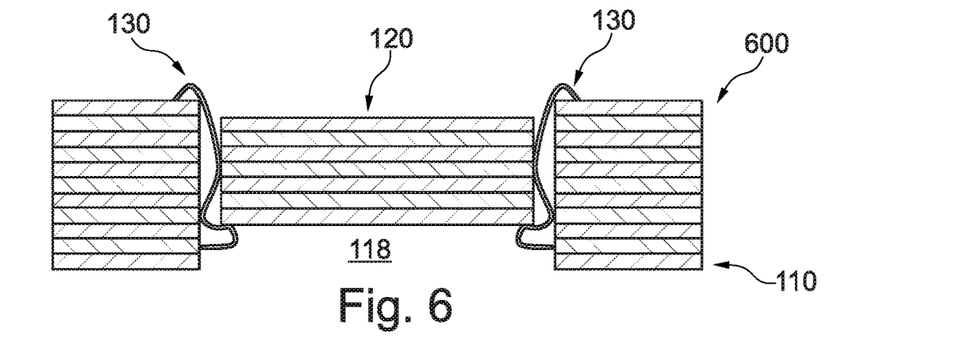
FIG. 6 illustrates a cross-sectional view of another component carrier arrangement, wherein the recess is a through hole and the elastic element comprises a curvature, according to another exemplary embodiment of the invention.

FIG. 6 illustrates a cross-sectional view of another component carrier arrangement 600, wherein the recess 118 is a through hole. The difference to the embodiment of FIG. 2 is, that the elastic element 130 is shaped such that the further component carrier 120 is not only connected in the recess 118 but is also held in place therein from below. Therefore, the elastic element 130 comprises an additional curvature that is placed below a bottom part of the further component carrier 120.

Figure 7:
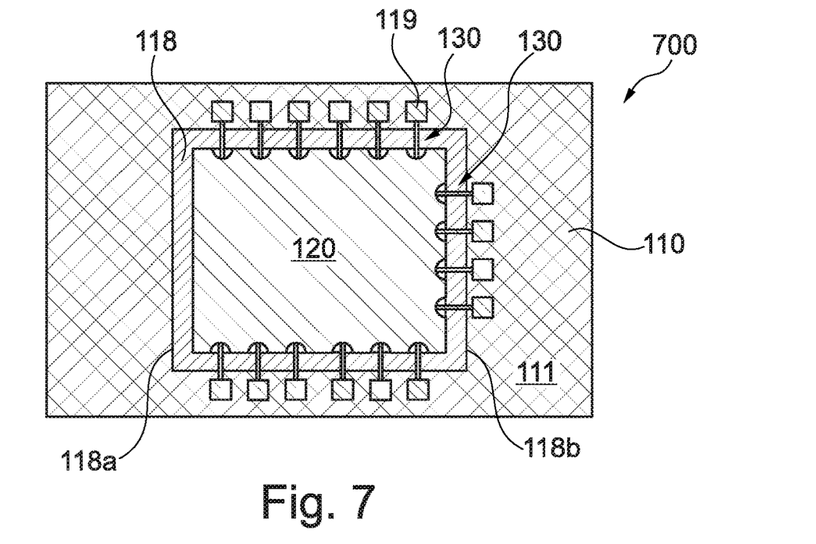
FIG. 7 illustrates a top view of another component carrier arrangement with a plurality of elastic elements according to an exemplary embodiment of the invention.

FIG. 7 illustrates a top view of a component carrier arrangement 700 with a plurality of elastic elements 130. These elastic elements 130 are arranged around the edge of the recess 118 and are fixed (attached) to the main surface 111 of the component carrier 110 using an adhesive 119.

Supplementarily, it should be noted that "comprising" does not exclude other elements or steps and the article "a" or "an" does not exclude a plurality. Furthermore, it is noted that features or steps, which are described with reference to one of the above embodiments, can also be used in combination with other features or steps of other examples described above.

REFERENCE Signs

100, 200, Arrangement, board-in-board arrangement
300, 400,
500, 600,
700
110 Component carrier
111 Main surface
112 Stack
114 Electrically conductive layer structure
116 Electrically insulating layer structure
118 Recess
118a,b Sidewalls of recess
118c Bottom surface/plane of recess
119 Adhesive
120 Further component carrier, electronic module
122 Further stack
124 Further electrically conductive layer structure
126 Further electrically insulating layer structure
128 Further recess
129 Electric contacts
130 Elastic element, spring element
510 Connection element
520 Thread

The invention claimed is:

1. A component carrier, comprising:
a stack having at least one electrically conductive layer structure and/or at least one electrically insulating layer structure; and
at least one elastic element attached to the stack and configured to reversibly connect the component carrier with a further component carrier, wherein the further component carrier comprises a further stack having at least one further electrically conductive layer structure and/or at least one further electrically insulating layer structure, by elastically deforming the at least one elastic element and essentially not deforming the stack and the further component carrier,
wherein the component carrier comprises a recess in the stack,
wherein the recess is configured such that the further component carrier is at least partially placeable into the recess and held in place by the at least one elastic element,
wherein the recess is a through hole,
wherein the elastic element is arranged at a sidewall of the recess between the stack and the further stack,
wherein a plurality of layer structures of the stack is exposed at the sidewall, and
wherein the elastic element at least partially covers at least some of the plurality of exposed layer structures.

2. The component carrier according to claim 1, wherein the elastic element is at least partially attached at a main surface of the stack.

3. The component carrier according to claim 1, wherein the at least one elastic element is at least one leaf spring.

4. The component carrier according to claim 1, wherein the at least one elastic element comprises an electrically conductive material, such that an electric connection can be established between at least one electrically conductive layer structure of the component carrier and the at least one further electrically conductive layer structure of the further component carrier, when the component carrier is connected with the further component carrier.

5. The component carrier according to claim 4, wherein the electric connection is established between sidewalls of the component carrier and the further component carrier via the at least one elastic element.

6. The component carrier according to claim 1, wherein the at least one elastic element is integrally formed with the stack.

7. The component carrier according to claim 1, comprising at least one of the following features:
wherein the at least one elastic element is configured for establishing a snap-fit connection between the component carrier and the further component carrier;
the component carrier comprises at least one component being surface mounted on and/or embedded in the component carrier, wherein the at least one component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
wherein at least one of the electrically conductive layer structures of the component carrier comprises at least one of the group consisting of copper, aluminum, nickel, silver, gold, palladium, and tungsten, any of the mentioned materials being optionally coated with supra-conductive material such as graphene;
the electrically insulating layer structure comprises at least one of a group consisting of resin, reinforced or non-reinforced resin, epoxy resin or bismaleimide-triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide;

the component carrier is shaped as a plate;

the component carrier is configured as one of a group consisting of a printed circuit board, a substrate, and an interposer;

the component carrier is configured as a laminate-type component carrier.

8. An arrangement, comprising:

a component carrier including a stack having at least one electrically conductive layer structure and/or at least one electrically insulating layer structure;

a further component carrier including a further stack having at least one further electrically conductive layer structure and/or at least one further electrically insulating layer structure; and at least one elastic element attached to the stack and configured to connect the component carrier with the further component carrier by the at least one elastic element, wherein the elastic element is elastically deformed and the stack and the further component carrier are essentially not deformed;

wherein the component carrier comprises a recess, wherein the recess is formed as a through hole, wherein the further component carrier is only connected in the recess by the elastic element, wherein the elastic element is arranged at a sidewall of the recess between the layer stack and the further layer stack, wherein a plurality of layer structures of the stack is exposed at the sidewall, and wherein the elastic element at least partially covers at least some of the plurality of exposed layer structures.

9. The arrangement according to claim 8, comprising at least one of the following features:

wherein the at least one elastic element is arranged at a sidewall of the recess, wherein the further component carrier is placed between the two sidewalls of the recess such that the at least one elastic element is arranged between a sidewall of the further component carrier and the sidewall of the recess, wherein the component carrier and/or the further component carrier comprises reinforcement elements.

10. A method of manufacturing a component carrier, comprising:

providing a stack including at least one electrically conductive layer structure and/or at least one electrically insulating layer structure;

attaching at least one elastic element to the stack; and reversibly connecting the component carrier with a further component carrier, wherein the further component carrier comprises a further stack having at least one further electrically conductive layer structure and/or at least one further electrically insulating layer structure, by elastically deforming the at least one elastic element without essentially deforming the stack and the further component carrier;

wherein the component carrier comprises a recess in the stack, wherein the recess is configured such that the further component carrier is at least partially placeable into the recess and held in place by the at least one elastic element, wherein the recess is a through hole, wherein the elastic element is arranged at a sidewall of the recess between the layer stack and the further layer stack, wherein a plurality of layer structures of the stack is exposed at the sidewall, and wherein the elastic element at least partially covers at least some of the plurality of exposed layer structures.

11. The method according to claim 10, wherein reversibly connecting is done mechanically and electrically.

* * * * *